(12) United States Patent
Nakagawa

(10) Patent No.: US 11,127,672 B2
(45) Date of Patent: Sep. 21, 2021

(54) BUSBAR ASSEMBLY

(71) Applicant: Suncall Corporation, Kyoto (JP)

(72) Inventor: Masaya Nakagawa, Kyoto (JP)

(73) Assignee: Suncall Corporation, Kyoto (JP)

( * ) Notice: Subject to any disclaimer, the term of this patent is extended or adjusted under 35 U.S.C. 154(b) by 0 days.

(21) Appl. No.: 16/642,789

(22) PCT Filed: Aug. 24, 2018

(86) PCT No.: PCT/JP2018/031315
§ 371 (c)(1),
(2) Date: Feb. 27, 2020

(87) PCT Pub. No.: WO2019/049687
PCT Pub. Date: Mar. 14, 2019

(65) Prior Publication Data
US 2020/0258833 A1 Aug. 13, 2020

(30) Foreign Application Priority Data

Sep. 8, 2017 (JP) ............................. JP2017-172884

(51) Int. Cl.
*H01L 23/50* (2006.01)
*H01L 21/48* (2006.01)
*H01L 33/62* (2010.01)

(52) U.S. Cl.
CPC .......... *H01L 23/50* (2013.01); *H01L 21/4839* (2013.01); *H01L 33/62* (2013.01)

(58) Field of Classification Search
CPC ...... H01L 23/50; H01L 21/4839; H01L 33/62
See application file for complete search history.

(56) References Cited

U.S. PATENT DOCUMENTS 10,907,268 B2  2/2021  Nakagawa et al.
2008/0251739 A1*  10/2008  Choi ................... G02B 6/43
                                                      250/551
(Continued)

FOREIGN PATENT DOCUMENTS

EP     1087300 A2    3/2001
JP     2007215340 A  8/2007
(Continued)

OTHER PUBLICATIONS

International Search Report issued in corresponding International Application No. PCT/JP2018/031315, dated Sep. 18, 2018.

*Primary Examiner* — Peniel M Gumedzoe
(74) *Attorney, Agent, or Firm* — Sterne, Kessler, Goldstein & Fox P.L.L.C.

(57) ABSTRACT

A busbar assembly according to the present invention includes a first busbar formed by a conductive metal flat plate; a second busbar formed by a conductive metal flat plate, the second busbar disposed in the same plane as the first busbar with a gap being provided between opposing side surfaces of the first and second busbars; and an insulating resin layer filled in the gap so as to mechanically connect the opposing side surfaces of the first and second busbars. Preferably, the opposing side surface of at least one of the first and second busbars is an inclined surface that is closer to the opposing side surface of the other of the first and second busbars from one side toward the other side in the thickness direction.

5 Claims, 8 Drawing Sheets

(56) References Cited

U.S. PATENT DOCUMENTS

| | | | | |
|---|---|---|---|---|
| 2011/0157851 A1* | 6/2011 | Lin | ............... | H01L 23/49861 |
| | | | | 361/757 |
| 2012/0015463 A1* | 1/2012 | Oyabu | ............... | H01L 24/97 |
| | | | | 438/27 |
| 2012/0205708 A1* | 8/2012 | Yoo | ............... | H01L 33/486 |
| | | | | 257/99 |
| 2013/0075154 A1* | 3/2013 | Saito | ............... | H01L 23/057 |
| | | | | 174/536 |
| 2013/0020644 A1 | 8/2013 | Ooishi et al. | | |
| 2015/0362136 A1* | 12/2015 | Bancken | ............... | F21K 9/90 |
| | | | | 362/294 |

FOREIGN PATENT DOCUMENTS

| | | |
|---|---|---|
| JP | 4432913 B2 | 3/2010 |
| JP | 2016216766 A | 12/2016 |
| WO | 2012053580 A1 | 4/2012 |

\* cited by examiner

BUSBAR ASSEMBLY

FIELD OF THE INVENTION

The present invention relates to a busbar assembly in which a plurality of busbars are mutually electrically insulated and mechanically connected.

BACKGROUND ART

Busbar assemblies in which a plurality of busbars are mutually electrically insulated and mechanically connected are proposed, and are used in various fields (see Patent Literatures 1 and 2 below).

However, since conventional busbar assemblies are of a laminated type in which a first flat plate busbar and a second flat plate busbar in parallel with each other are vertically laminated, it is difficult to downsize in a vertical direction.

Moreover, since, in the conventional busbar assemblies, the entirety of an upper surface of the first flat plate busbar and the entirety of a lower surface of the second flat plate busbar are disposed to face each other with an insulating resin therebetween, it is difficult to ensure sufficient reliability with respect to insulation.

In particular, if the insulating resin between the first flat busbar and the second flat busbar is made thin in order to downsize in a vertical direction, there may be an occurrence of leakage current between the first and second flat busbars.

PRIOR ART DOCUMENT

Patent Literature

Patent Literature 1: Japanese Patent No. 4432913
Patent Literature 1: JP 2016-216766A

DISCLOSURE OF THE INVENTION

The present invention has been conceived in view of the conventional art described above, and an object of the present invention is to provide a busbar assembly capable of being downsized in a vertical direction while realizing electric insulation between a plurality of busbars.

In order to achieve the object, the present invention provides a busbar assembly including: a first busbar formed by a conductive metal flat plate; a second busbar formed by a conductive metal flat plate, wherein the second busbar is disposed in the same plane as the first busbar with a gap being provided between opposing side surfaces of the first and second busbars; and an insulating resin layer filled in the gap so as to mechanically connect the opposing side surfaces of the first and second busbars.

Since the first and second busbars formed by conductive metal flat plates that are disposed in the same plane with a gap being provided between the opposing side surfaces of the first and second busbars are mechanically connected to each other by the insulating resin layer filled in the gap, the busbar assembly according to the present invention makes it possible to be downsized in the vertical direction while realizing electric insulation between the first and second busbars.

Preferably, the opposing side surface of at least one of the first and second busbars is an inclined surface that is closer to the opposing side surface of the other of the first and second busbars from one side toward the other side in the thickness direction.

More preferably, the opposing side surfaces of both of the first and second busbars are inclined surfaces that are closer to each other from one side toward the other side in the thickness direction.

In one embodiment, the insulating resin layer is provided on at least one of surfaces on one side and the other side in the thickness direction of the first and second busbars in addition to within the gap.

Furthermore, in order to achieve the object, the present invention provides a busbar assembly including: a plurality of busbars respectively formed by conductive metal flat plates, wherein the plurality of busbars are disposed in the same plane with gaps being provided between adjacent busbars; and an insulating resin layer filled in the gap so as to mechanically connect adjacent busbars while electrically insulating them.

Since the plurality of busbars respectively formed by conductive metal flat plates that are disposed in the same plane with gaps being provided between the opposing side surfaces of the adjacent busbars are mechanically connected to each other by the insulating resin layer filled in the gaps, the busbar assembly according to the present invention makes it possible to be downsized in the vertical direction while realizing electric insulation among the plurality of busbars.

EMBODIMENT FOR CARRYING OUT THE INVENTION

Below, one embodiment of a busbar assembly according to the present invention will now be described with reference to the appended drawings.

Figure 1A:
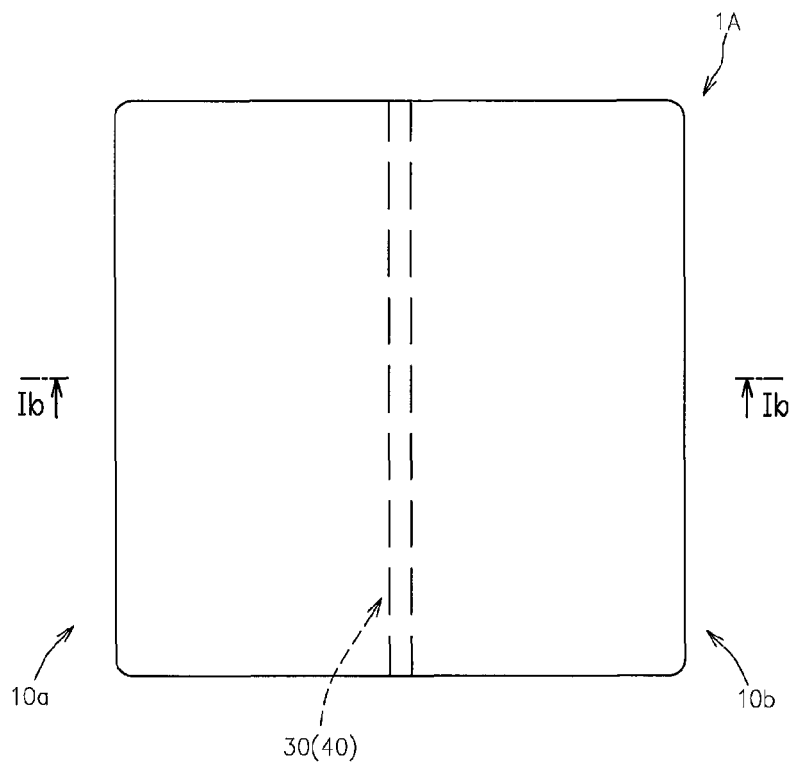
FIG. 1A is a plan view of a busbar assembly according to one embodiment of the present invention.
Figure 1B:
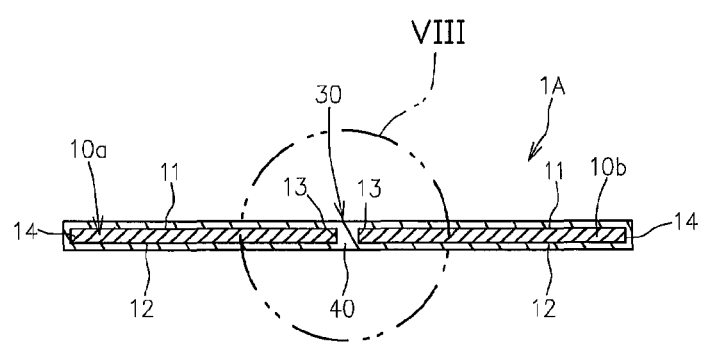
FIG. 1B is a cross-sectional view taken along the line Ib-Ib in FIG. 1A.

FIG. 1A shows a plan view of a busbar assembly 1A according to the present embodiment, and FIG. 1B shows a cross-sectional view taken along the line Ib-Ib in FIG. 1A.

As shown in FIG. 1A and FIG. 1B, the busbar assembly 1A has conductive metal flat plate first and second busbars 10a, 10b disposed in the same plane, with a gap 40 being provided between the opposing side surfaces thereof and an insulating resin layer 30 filled in the gap 40 between the opposing side surfaces of the first and second busbars 10a, 10b, wherein the insulating resin layer 30 electrically insulates the first and second busbars 10a, 10b and mechanically connects the opposing side surfaces of the first and second busbars 10a, 10b.

The first and second busbars 10a, 10b are formed of a conductive metal flat plate of Cu or the like, and have first surfaces 11 on one side in the thickness direction, second surfaces 12 on the other side in the thickness direction, opposing side surfaces 13 facing each other, and outer side surfaces 14 facing mutually opposite directions as viewed in a cross-sectional diagram taken in the thickness direction shown in FIG. 1B.

The insulating resin layer 30 is formed of a resin having heat resistance and insulating properties, and, for example, polyimide, polyamide, epoxy, or the like is preferably used.

In the busbar assembly 1A, the insulating resin layer 30 fills the gap 40 between the opposing side surfaces 13 of the first and second busbars 10a, 10b and covers the first surfaces 11, the second surfaces 12, and the outer side surfaces 14 of the first and second busbars 10a, 10b.

Figure 1C:
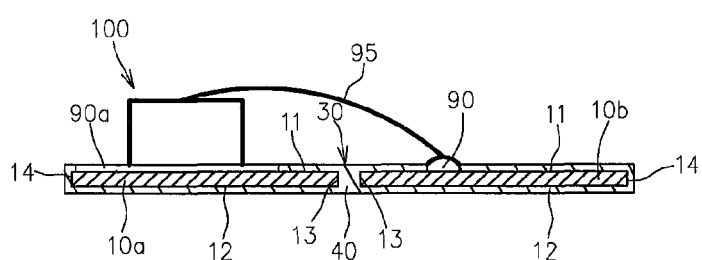
FIG. 1C is a cross-sectional view taken along the same line as FIG. 1B in a state where a semiconductor element is attached to the busbar assembly.

FIG. 1C shows a cross-sectional view of the busbar assembly 1A to which a semiconductor element 92 such as an LED is attached.

One of the first and second busbars 10a, 10b functions as a positive electrode, and the other functions as a negative electrode.

In the embodiment shown in FIG. 1C, the semiconductor element 92 has one of the positive electrode and the negative electrode on the lower surface and the other of the positive electrode and the negative electrode on the upper surface.

In this case, the lower surface of the semiconductor element 92 is die-bonded so as to be electrically connected to a first plated layer 90a provided on the first surface 11 of one of the first and second busbars 10a, 10b (the first busbar 10a in the depicted embodiment), and the upper surface is electrically connected to a second plated layer 90b provided on the first surface 11 of the other of the first and second busbars 10a, 10b (the second busbar 10b in the depicted embodiment) via wire bonding 95.

According to the busbar assembly 1A having the above configuration, it is possible to be downsized in the vertical direction (the thickness direction) since the first and second busbars 10a, 10b are disposed in the same plane.

Moreover, since the first and second busbars 10a, 10b are disposed so that their opposing side surfaces 13 face each other, the busbar assembly 1A makes it possible to reduce the facing surface area between the first and second busbars 10a, 10b as much as possible in comparison with a busbar assembly of a type in which a plurality of busbars are vertically laminated. Therefore, it is possible to prevent or reduce leakage current between the first and second busbars 10a, 10b.

Next, a first manufacturing method for manufacturing the busbar assembly 1A will now be described.

The first manufacturing method has a step of providing a conductive metal flat plate 100 having a busbar assembly forming region 120 having the same thickness as the first and second busbars 10a, 10b; and a slit forming step of forming a slit 125 in the busbar assembly forming region 120, wherein the slit 125 penetrates a first surface 121 on one side in the thickness direction and a second surface 122 on the other side in the thickness direction.

Figure 2:
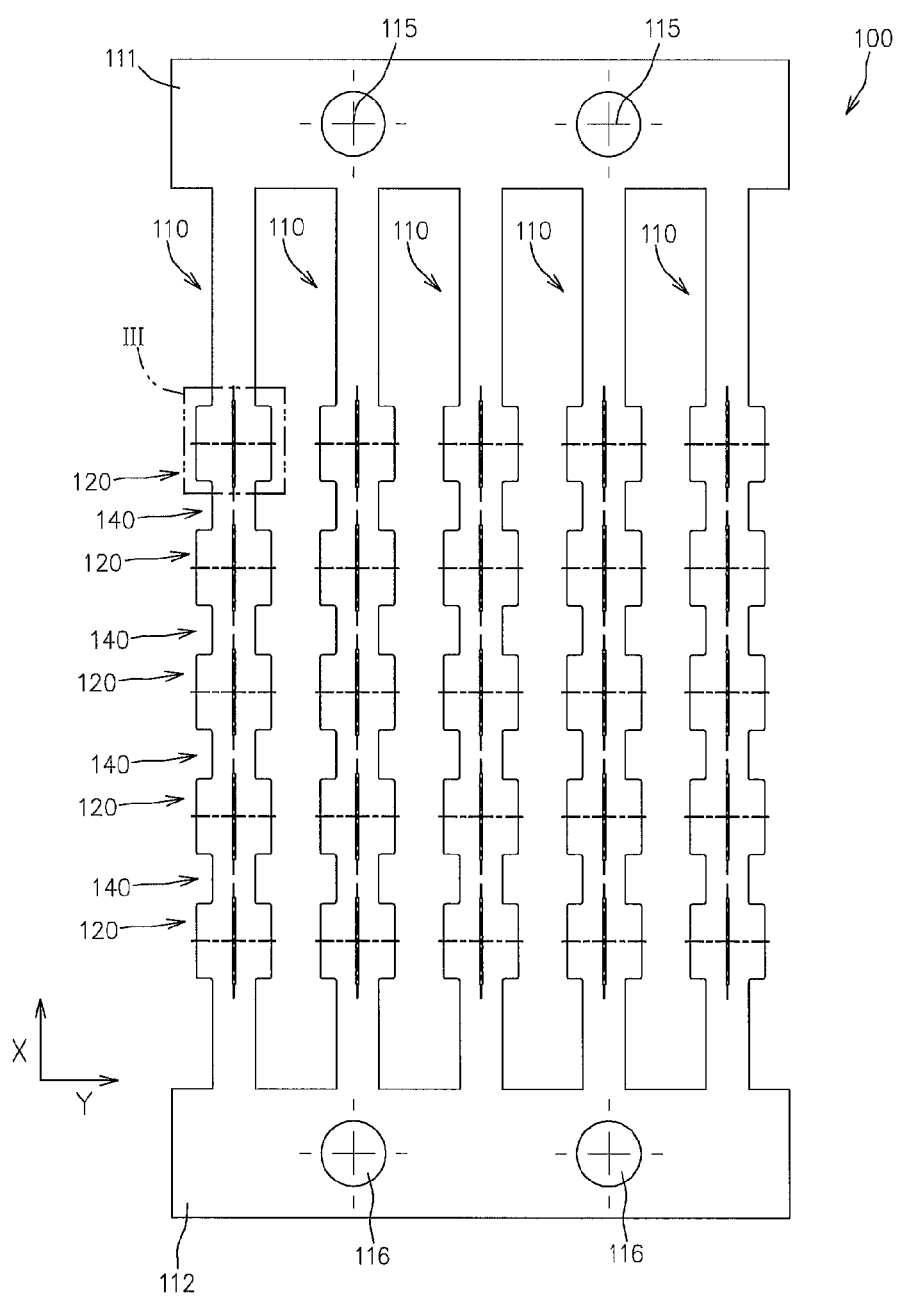
FIG. 2 is a plan view of a conductive metal flat plate used in a first manufacturing method for manufacturing the busbar assembly according to the embodiment, and shows a state after a slit forming step of the first manufacturing method is complete.

FIG. 2 shows a plan view of the conductive metal flat plate 100 after the slit forming step is complete.

Figure 3A:
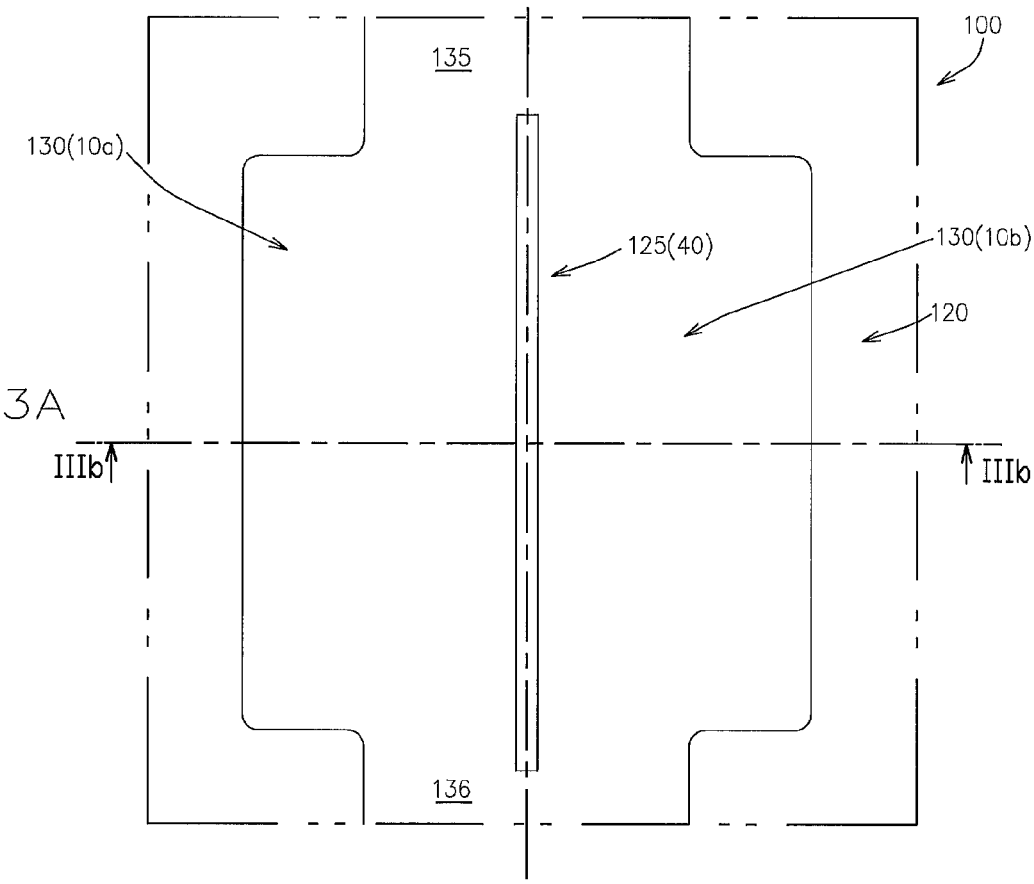
FIG. 3A is an enlarged view of a busbar assembly forming region shown by the III part in FIG. 2.
Figure 3B:
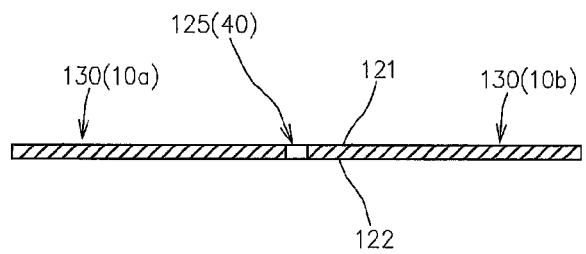
FIG. 3B is a cross-sectional view taken along the line in FIG. 3A.

FIG. 3A shows an enlarged view of the III part in FIG. 2, and FIG. 3B shows a cross-sectional view taken along the line in FIG. 3A.

The slit 125 forms the gap 40 between the opposing side surfaces 13 of the first and second busbars 10a, 10b in the busbar assembly 1A. The width of the gap 40, i.e., the width of the slit 125, is determined in accordance with the specifications of the busbar assembly 1A.

As shown in FIG. 3A and FIG. 3B, the conductive metal flat plate 100 after the slit forming step is configured such that a pair of busbar forming parts 130, 130 facing each other with the slit 125 therebetween remain connected to each other via a connecting part 135 of the conductive metal flat plate 100 located more toward one side in the longitudinal direction of the slit 125 than the slit 125 is and a connecting part 136 of the conductive metal flat plate 100 located more toward the other side in the longitudinal direction of the slit 125 than the slit 125 is.

Due to this configuration, the slit 125 can be formed highly accurately.

As shown in FIG. 2, the conductive metal flat plate 100 has a plurality of busbar assembly forming regions 120 disposed in the X direction in the X-Y plane where the conductive metal flat plate 100 is located, and connecting regions 140 for connecting the busbar assembly forming regions 120 adjacent in the X direction, and thus the plurality of busbar assembly forming regions 120 can be simultaneously processed.

In the embodiment shown in FIG. 2, five busbar assembly forming regions 120 are disposed in series in the X direction (in the top-bottom direction of the drawing).

Moreover, in the first manufacturing method, as shown in FIG. 2, a busbar assembly forming strip 110 is formed of the plurality of busbar assembly forming regions 120 disposed in the X direction and the connecting regions 140 connecting the busbar assembly forming regions 120 adjacent in the X direction, and a plurality of busbar assembly forming strips 110 are disposed in parallel in the Y direction perpendicular to the X direction in the X-Y plane.

Specifically, in the first manufacturing method, the conductive metal flat plate 100 has a plurality of (five in the depicted embodiment) busbar assembly forming strips 110 disposed in parallel in the Y direction, a busbar-side first connecting strip 111 for connecting the end parts on one side in the X direction of the plurality of busbar assembly forming strips 110 to each other, and a busbar-side second connecting strip 112 for connecting the end parts on the other side in the X direction of the plurality of busbar assembly forming strips 110 to each other.

With the conductive metal flat plate 100 thus configured, a greater number of busbar assemblies 1A can be simultaneously manufactured.

The first manufacturing method includes, after the slit forming step, a coating step of coating the conductive metal flat plate 100 with a coating material containing an insulating resin such that at least the slit 125 is filled with the insulating resin layer 30, and a curing step of curing the coating material applied in the coating step to form the insulating resin layer 30.

Figure 4:
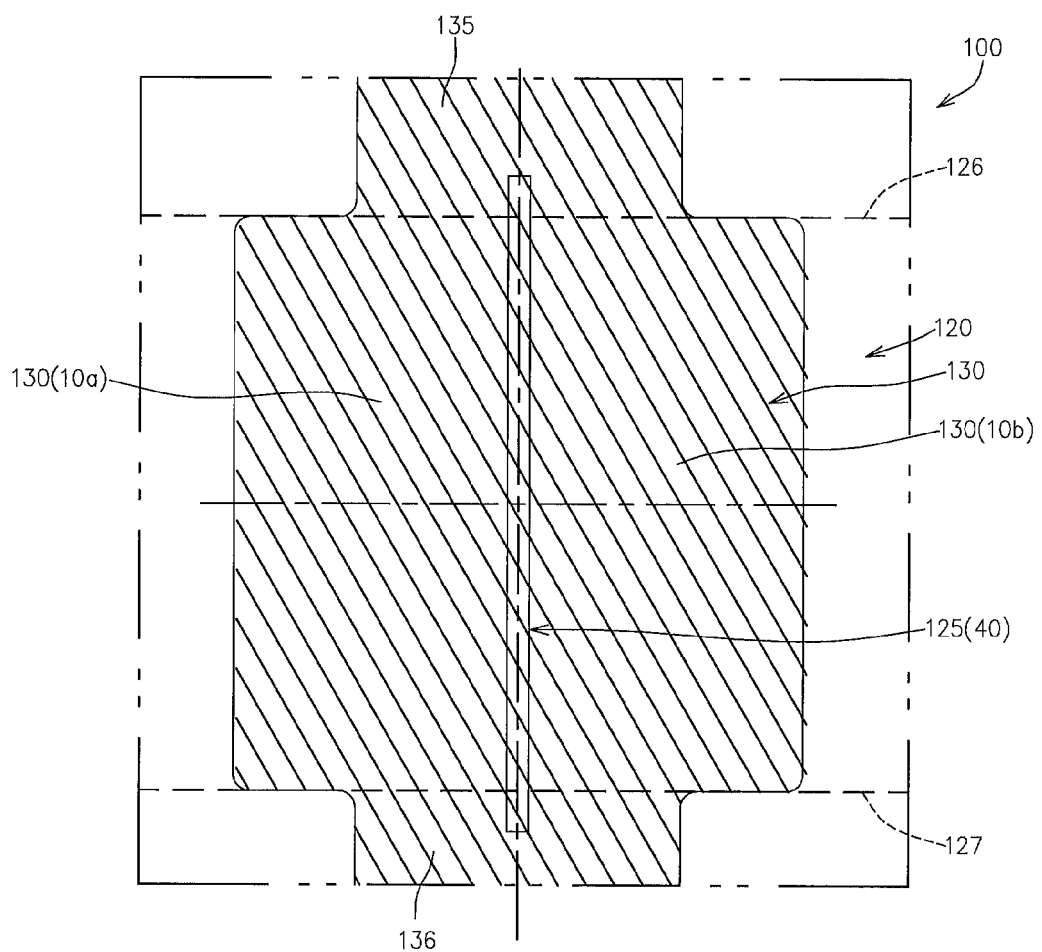
FIG. 4 is an enlarged plan view of the busbar assembly forming region, and shows a state after a busbar-side curing step of the first manufacturing method is complete.

FIG. 4 shows an enlarged plan view of the busbar assembly forming region 120 at the time when the curing step is complete.

The coating step is performed by electrodeposition coating involving an electrodeposition coating material containing an insulating resin having heat resistance and insulating properties, such as polyimide, polyamide, or epoxy.

Alternatively, the coating step can be performed by electrostatic powder coating involving powders of the insulating resin.

Also, in a case where the filling of the resin into the slit 125 can be sufficiently ensured, the coating step can be performed by spray coating.

The curing step is performed by thermally treating the coating material applied in the coating step at a suitable temperature.

In the busbar assembly 1A according to the present embodiment, the insulating resin layer 30 is provided on both the first surface 121 on one side in the thickness direction and the second surface 122 on the other side in the thickness direction in addition to within the gap 40.

Alternatively, it is possible to provide the insulating resin layer 30 only within the gap, and also possible to provide the insulating resin layer 30 on only one of the first and second surfaces 121, 122 in addition to within the gap 40.

In a case where the insulating resin layer 30 is not provided on either one or both of the first and second surfaces 121, 122, the coating step is performed in a state where a surface of the first and second surfaces 121,122 on which the insulating resin layer 30 is not provided is covered with a mask.

The first manufacturing method has, after the curing step, a cutting step of cutting off the insulating resin layer 30 in the slit 125 and the pair of busbar forming parts 130 of the conductive metal flat plate 100 from the conductive metal flat plate 100, wherein the busbar forming parts 130 face each other with the slit 125 therebetween.

In the first manufacturing method, as described above, the busbar forming parts 130 facing each other with the slit 125 therebetween are connected to each other via the connecting part 135 of the conductive metal flat plate 100 located more toward one side in the longitudinal direction of the slit 125 than the slit 125 is and the connecting part 136 of the conductive metal flat plate 100 located more toward the other side in the longitudinal direction of the slit 125 than the slit 125 is.

In this case, as shown in FIG. 4, the cutting step includes a process of cutting the conductive metal flat plate 100 in the thickness direction along a cutting line 126 set so as to cross the slit 125 in the width direction on one side in the longitudinal direction of the slit 125 and a process of cutting the conductive metal flat plate 100 in the thickness direction along a cutting line 127 set so as to cross the slit 125 in the width direction on the other side in the longitudinal direction of the slit 125.

As in the first manufacturing method, in a case where the conductive metal flat plate 100 has the plurality of busbar assembly forming regions 120 disposed in the X direction and the connecting regions 140 for connecting the busbar assembly forming regions 120 adjacent in the X direction, the slit 125 is formed such that its longitudinal direction is in the X direction.

According to the first manufacturing method, the busbar assembly 1A shown in FIG. 1, i.e., the busbar assembly 1A in which the first and second busbars 10, 20 are electrically insulated and mechanically connected by the insulating resin layer 30, can be efficiently manufactured.

That is to say, in the first manufacturing method, with the relative positions of the pair of busbar forming parts 130 for forming the first and second busbars 10a, 10b being secured, the insulating resin layer 30 is filled into the slit 125 between the pair of busbar forming parts 130, and then the pair of busbar forming parts 130 and the insulating resin layer 30 are cut out from the conductive metal flat plate 100, and thus the busbar assembly 1A in which the first and second busbars 10a, 10b are electrically insulated and mechanically connected by the insulating resin layer 30 is manufactured.

Therefore, according to the first manufacturing method, it is possible to efficiently manufacture the busbar assembly 1A in which the first and second busbars 10a, 10b are precisely disposed in the desired relative positions while reliably ensuring electrical insulation between the first and second busbars 10a, 10b.

The busbar assembly 1A can be also manufactured by a below explained second manufactured method different from the first manufactured method.

Figure 5:
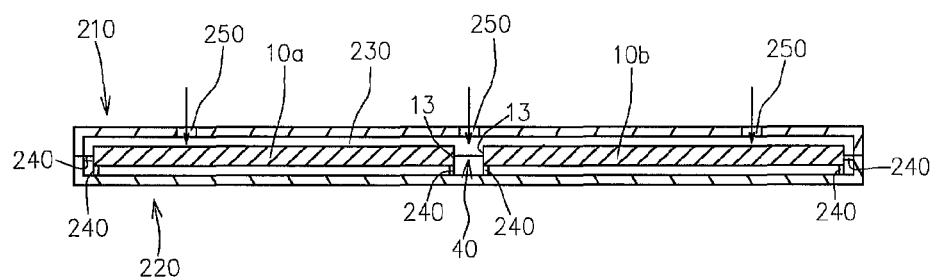
FIG. 5 is a cross-sectional view for explaining a second manufacturing method for manufacturing the busbar assembly according to the embodiment.

FIG. 5 shows a cross-sectional view for explaining the second manufacturing method.

The second manufacturing method has a step of providing the first and second busbars 10a, 10b; a step of providing first and second molds 210, 220 connected to each other in a separable manner; a step in disposing the first and second busbars 10a, 10b in parallel within a surrounding space 230 formed by the first and second molds 210, 220; a step of injecting an insulating resin into the surrounding space 230 in which the first and second busbars 10a, 10b are disposed in parallel; and a step of curing the insulating resin by heat treatment.

Spacers 240 are provided on an inner surface of the first mold 210 and/or the second mold 220, and the first and second busbars 10a, 10b are disposed in parallel in the same plane while arranging the gap 40 between the opposing side surfaces 13, 13 of the first and second busbars 10a, 10 by way of the spacers 240.

Further, the first mold 210 and/or the second mold 220 are provided with a communication hole 250 that opens the surrounding space 230 to the outside, and the insulating resin is injected into the surrounding space 230 through the communication hole 250.

Furthermore, the busbar assembly 1A can be also manufactured by a below explained third manufacturing method.

The third manufacturing method has a step of providing the first and second busbars 10a, 10b; a step of coating the respective outer surfaces of the first and second busbars 10a, 10b with an insulating resin by electrodeposition coating, electrostatic powder coating or spray coating; a step of curing the insulating resin on the outer surfaces of the first and second busbars 10a, 10b by heat treatment so that at least one of the resin on the outer surfaces of the first and second busbars 10a, 10b is become semi-cured state; and a step of curing the semi-cured insulating resin by heat treatment, with the opposing side surfaces 13, 13 of the first and second busbars 10a, 10b being brought into contact to each other, to thereby cause the first and second busbars 10a, 10b to connect to each other by the insulating layer 30.

Figure 6:
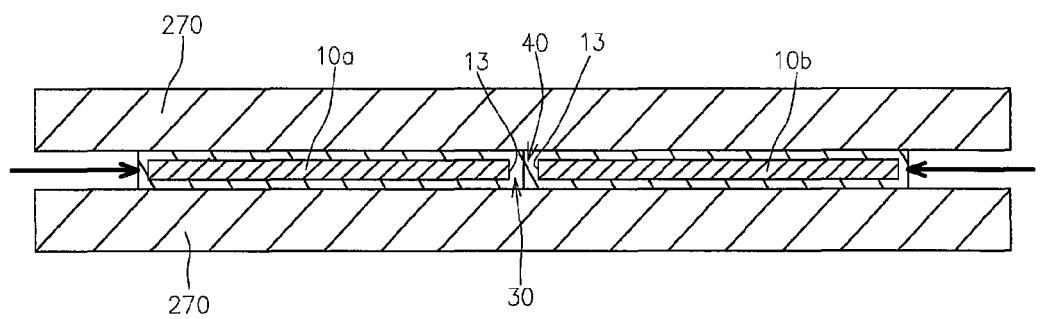
FIG. 6 is a cross-sectional view for explaining a third manufacturing method for manufacturing the busbar assembly according to the embodiment.

When bring the opposing side surfaces 13, 13 of the first and second busbars 10a, 10b into contact to each other, as shown in FIG. 6, a pair of guides 270, which are disposed away to each other by such a distance to allow the first and second busbars 10a, 10b with the outer surfaces being coated with the resin to be inserted in a plane direction, are provided, and the opposing side surfaces 13, 13 of the first and second busbars 10a, 10b are brought into contact to each other within the pair of guides 270, 270.

In the third manufacturing method, the width of the gap 40 between the first and second busbars 10a, 10b is defined by the thickness of the insulating resin 30 provided on the outer surfaces of the first and second busbars 10a, 10b.

Although the busbar assembly 1A according to the present embodiment has two busbars including the first and second busbars 10a, 10b, and one insulating resin layer 30 connecting the first and second busbars 10a, 10b, the present invention is not limited to this embodiment and can have three or more busbars.

Figure 7A:
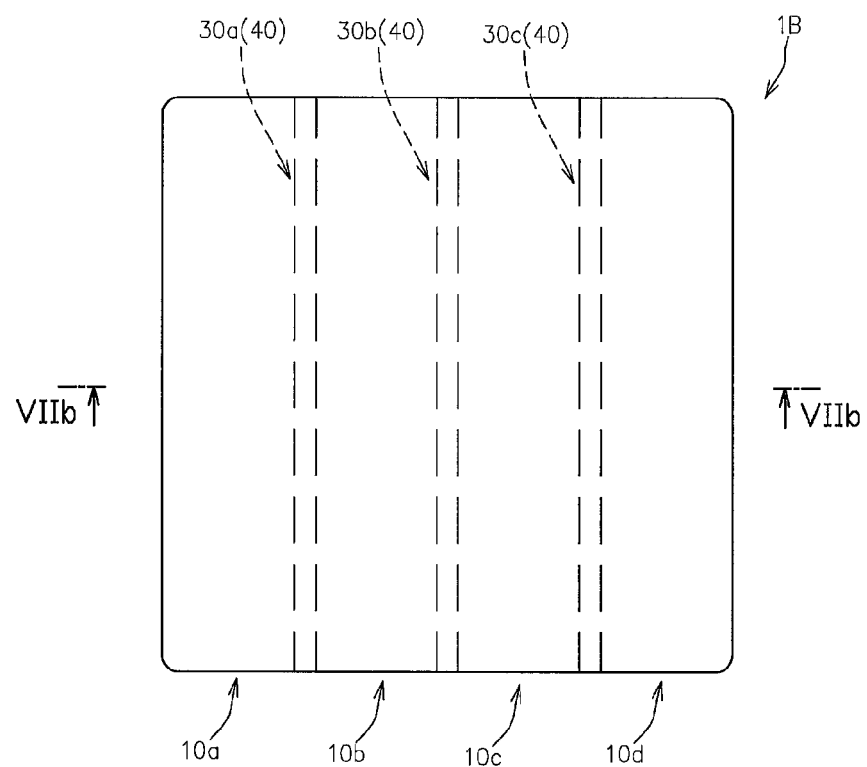
FIG. 7A is a plan view of a busbar assembly according to a first modification of the embodiment.
Figure 7B:
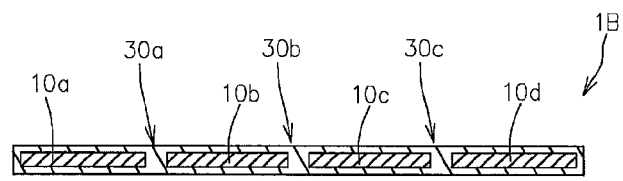
FIG. 7B is a cross-sectional view taken along the line VIIb-VIIb in FIG. 7A.

FIG. 7A shows a plan view of a busbar assembly 1B according to a first modification of the present embodiment, and FIG. 7B shows a cross-sectional view taken along the line VIIb-VIIb in FIG. 7A.

The busbar assembly 1B according to the first modification shown in FIGS. 7A and 7B has first to fourth busbars 10a-10d, an insulating resin layer 30a that electrically insulates and mechanically connects the adjacent first and second busbars 10a, 10b, an insulating resin layer 30b that electrically insulates and mechanically connects the adjacent second and third busbars 10b, 10c, and an insulating resin layer 30c that electrically insulates and mechanically connects the adjacent third and fourth busbars 10c, 10d.

The busbar assembly with three or more busbars such as the busbar assembly 1A according to the first modification can be efficiently manufactured by the first manufacturing method.

That is to say, it is possible to easily increase the number of busbars 10a-10d by increasing the number of slits 125 that are formed in the conductive metal flat plate 100.

Specifically, the busbar assembly 1B according to the first modification can be easily manufactured by forming three slits 125 parallel one another in the conductive metal flat plate 100, curing insulating resin filled into the three slits 125, and then cutting the conductive metal flat plate 100 so as to cross the three slits 125 in the width direction.

In the busbar assembly 1A according to the present embodiment, as shown in FIG. 1B, although the opposing side surfaces 13, 13 of the first and second busbars 10a, 10b that face each other with the gap 40 therebetween are vertical surfaces along the thickness direction, the present invention is not limited to the embodiment. It is possible that one or both of the opposing side surfaces 13, 13 of the first and second busbars 10a, 10b with the gap 40 therebetween is an inclined surface.

Figure 8A:
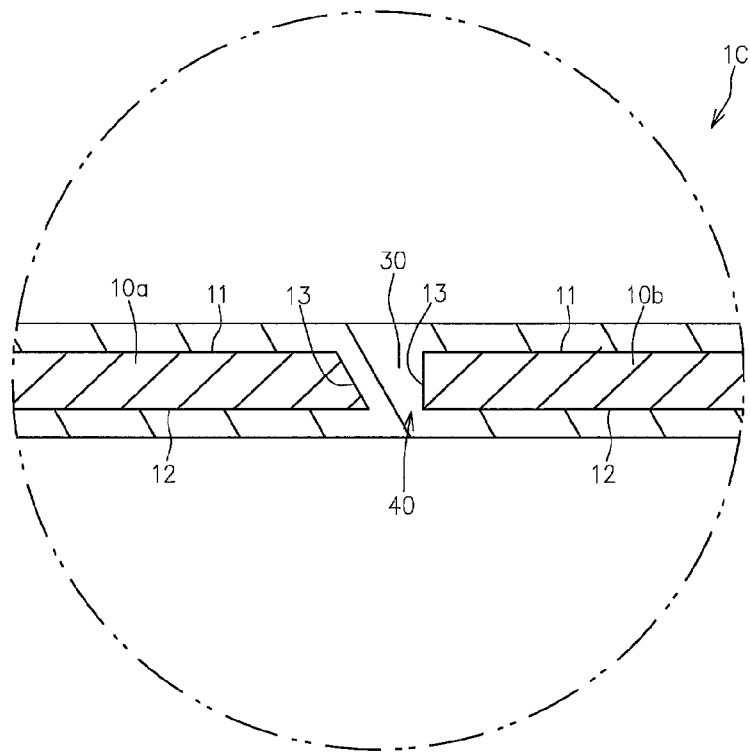
FIGS. 8A and 8B are cross-sectional views of parts of busbar assemblies according to second and third modifications of the embodiment, respectively, and show the respective parts correspond to the VIII part in FIG. 1B.

FIG. 8A shows a cross-sectional view of a part of a busbar assembly 1C according to a second modification of the present embodiment, wherein the part corresponds to the VIII part in FIG. 1B.

As shown in FIG. 8A, in the busbar assembly 1C according to the second modification, the opposing side surface 13 of one of the first and second busbars 10a, 10b (the second busbar 10b in the depicted embodiment) is a vertical surface extending in the thickness direction, while the opposing side surface 13 of the other of the first and second busbars 10a, 10b (the first busbar 10a in the depicted embodiment) is an inclined surface that is closer to the opposing side surface 13 of the opposing busbar (the second busbar 10b in the depicted embodiment) from the first surface 11 on one side in the thickness direction toward the second surface 12 on the other side in the thickness direction.

Figure 8B:
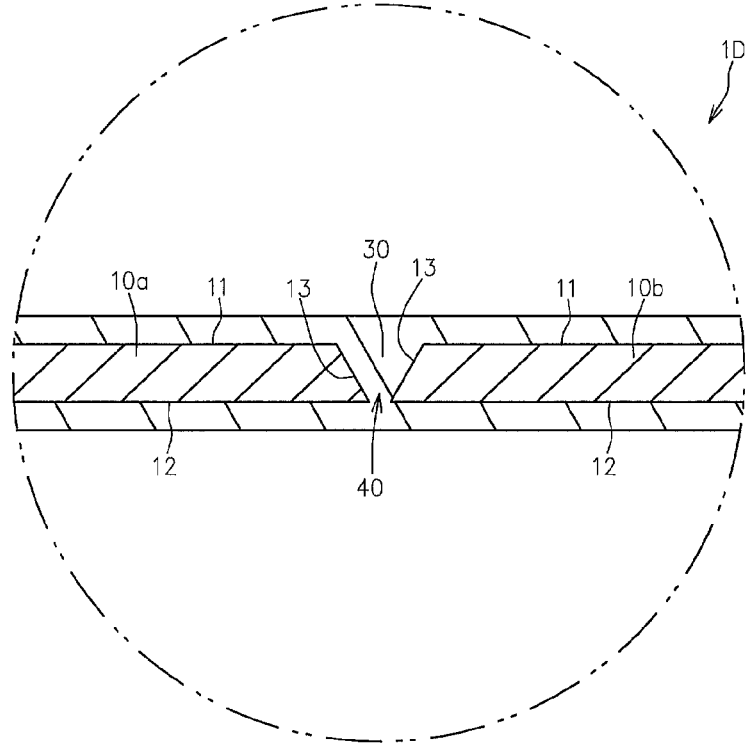

FIG. 8B shows a cross-sectional view of a part of a busbar assembly 1D according to a third modification of the present embodiment, wherein the part corresponds to the VIII part in FIG. 1B.

As shown in FIG. 8B, in the busbar assembly 1D according to the third modification, the opposing side surfaces 13 of both of the first and second busbars 10a, 10b are inclined surface that are closer to the opposing side surface 13 of the opposing busbar from the first surface 11 on one side in the thickness direction toward the second surface 12 on the other side in the thickness direction.

That is to say, in the third modification, the opposing side surface 13 of the first busbar 10a is the inclined surface that is closer to the opposing side surface 13 of the second busbar 10b from the first surface 11 on one side in the thickness direction toward the second surface 12 on the other side in the thickness direction, and the opposing side surface 13 of the second busbar 10b is the inclined surface that is closer to the opposing side surface 13 of the first busbar 10a from the first surface 11 on one side in the thickness direction toward the second surface 12 on the other side in the thickness direction.

The second and third modifications 1C, 1D makes it possible to enlarge a surface area of the first and/or second busbars 10a, 10b to enhance heat dissipation capacity of the busbar assembly 1C, 1C while reliably ensuring the gap 40 between the opposing side surfaces 13, 13 of the first and second busbars 10a, 10b.

In particular, this effect is useful in a case where a pyrogenic semiconductor element 92 such as an LED is attached to the busbar assemblies 1C, 1D.

The busbar assemblies 1C, 1D can be easily manufactured by changing a cross-sectional shape of the slit 125 in the first manufacturing method.

Each of the busbar assemblies according to the above-explained embodiments and modifications may have a frame 50 forming a block structure for a sealing resin encapsulating the semiconductor element 92 attached thereto.

Figure 9:
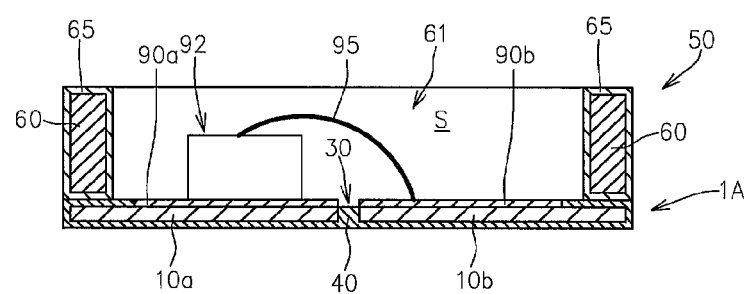
FIG. 9 is a vertical cross-sectional view of the busbar assembly according to the embodiment, wherein a frame and a semiconductor element are attached to the busbar assembly.

FIG. 9 shows a vertical cross-sectional view of the busbar assembly 1A with according to the first embodiment, wherein the frame 50 and the semiconductor element 92 are attached to the busbar assembly 1A.

The frame 50 is configured so as to define a mount space S that surrounds the semiconductor element 92 attached to one of the first and second busbars 10a, 10b and that is open upward.

Specifically, the frame 50 has a cylinder shape frame body 60 having the central hole 61 penetrating in the axial direction and a frame-side insulating resin layer 65 covering the outer circumferential surface of the frame body 60.

The frame body 60 can be formed by, for example, pressing a metal flat plate having a thickness corresponding to the length in the axial direction of the frame body 60 to form the central hole 61.

The frame-side insulating resin layer 65 is formed of, for example, polyimide, polyamide, epoxy, or the like.

The frame 50 is fixed to the busbar assembly 1A by, for example, pressing the frame 50 and the busbar assembly 1A to each other with at least one of the frame-side insulating resin layer 65 and the insulating resin layer 30 being semi-cured, and then curing the semi-cured insulating resin layer.

The semi-cured state of the frame-side insulating resin layer 65 and the insulating resin layer 30 can be obtained by suitably regulating the temperature during heat treatment.

An insulating resin (not shown) such as epoxy is injected into the mount space S after the semiconductor element 92 is attached, and thus the semiconductor element 92 is encapsulated within the resin.

DESCRIPTION OF THE REFERENCE NUMERALS 1A-1D Busbar assembly
10a-10d Busbar

11 First surface
12 Second surface
13 Opposing side surface
30 Insulating resin layer
40 Gap

The invention claimed is:

1. A busbar assembly comprising:
a first busbar comprising a conductive metal flat plate;
a second busbar comprising a conductive metal flat plate, wherein the first and second busbars are disposed in a common plane with a gap being provided between opposing side surfaces of the first and second busbars;
an insulating resin layer filled in the gap so as to mechanically connect the opposing side surfaces of the first and second busbars; and
a frame fixed to a first surface on one side in a thickness direction of a connected body to form a mount space to surround a semiconductor element to be attached to the busbar assembly,
wherein the connected body is formed by the first and second busbars connected by the insulating resin layer, and
wherein the frame is open upward, and includes a frame body having a cylindrical shape with a central hole formed by pressing a metal flat plate, and a frame-side insulating resin layer covering an outer surface of the frame body.

2. The busbar assembly according to claim 1, wherein the opposing side surface of at least one of the first and second busbars is an inclined surface that is closer to the opposing side surface of the other of the first and second busbars from the one side toward another side in the thickness direction.

3. The busbar assembly according to claim 2, wherein the opposing side surfaces of both of the first and second busbars are inclined surfaces that are closer to each other from the one side toward the other side in the thickness direction.

4. The busbar assembly according to claim 1, wherein the insulating resin layer is provided on at least one of surfaces on the one side and another side in the thickness direction of the first and second busbars in addition to within the gap.

5. A busbar assembly comprising:
a plurality of busbars comprising conductive metal flat plates, wherein the plurality of busbars are disposed in a common plane with gaps being provided between adjacent busbars;
an insulating resin layer filled in the gap so as to mechanically connect adjacent busbars while electrically insulating them; and
a frame fixed to a first surface on one side in a thickness direction of a connected body to form a mount space to surround a semiconductor element to be attached to the busbar assembly,
wherein the connected body is formed by the plurality of busbars connected by the insulating resin layer, and
wherein the frame is open upward, and includes a frame body having a cylindrical shape with a central hole formed by pressing a metal flat plate, and a frame-side insulating resin layer covering an outer surface of the frame body.

* * * * *